(12) United States Patent
Liang et al.

(10) Patent No.: US 10,707,866 B1
(45) Date of Patent: Jul. 7, 2020

(54) CAPACITANCE BALANCE IN DUAL SIDED CONTACT SWITCH

(71) Applicant: QUALCOMM Incorporated, San Diego, CA (US)

(72) Inventors: Qingqing Liang, San Diego, CA (US); Ravi Pramod Kumar Vedula, San Diego, CA (US); George Peter Imthurn, San Diego, CA (US); Christopher Nelles Brindle, Poway, CA (US); Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/230,884

(22) Filed: Dec. 21, 2018

(51) Int. Cl.

| H03K 17/687 | (2006.01) |
|---|---|
| H03K 17/10 | (2006.01) |
| H03K 17/284 | (2006.01) |
| H01L 27/12 | (2006.01) |
| H01L 23/50 | (2006.01) |
| H01L 21/76 | (2006.01) |
| H01L 21/84 | (2006.01) |
| H01L 23/66 | (2006.01) |
| H01L 21/762 | (2006.01) |

(52) U.S. Cl.
CPC ..... *H03K 17/687* (2013.01); *H01L 21/76264* (2013.01); *H01L 21/84* (2013.01); *H01L 23/50* (2013.01); *H01L 23/66* (2013.01); *H01L 27/1203* (2013.01); *H03K 17/102* (2013.01); *H03K 17/284* (2013.01)

(58) Field of Classification Search
CPC .. H03K 17/687; H03K 17/102; H03K 17/284; H01L 21/76264; H01L 23/50; H01L 23/66; H01L 21/84; H01L 27/1203
USPC ........................................................ 257/365
See application file for complete search history.

(56) References Cited

U.S. PATENT DOCUMENTS

| 9,252,077 B2 * | 2/2016 | Molzer ................. H01L 23/481 |
| 2008/0179678 A1 * | 7/2008 | Dyer ..................... H01L 23/485 |
| | | 257/351 |
| 2010/0156511 A1 * | 6/2010 | Botula ................ H01L 27/1203 |
| | | 327/535 |

(Continued)

OTHER PUBLICATIONS

International Search Report and Written Opinion—PCT/US2019/064819—ISA/EPO—dated Mar. 13, 2020.

*Primary Examiner* — Caleen O Sullivan
(74) *Attorney, Agent, or Firm* — Qualcomm Incorporated/Seyfarth Shaw LLP (57) ABSTRACT

A dual sided contact switch has a first independent drain/source region of a multi-gate active device. The dual sided contact switch also has a first shared drain/source region of the multi-gate active device. The dual sided contact switch has a second independent drain/source region of the multi-gate active device, adjacent to the first shared drain/source region. The dual sided contact switch also has a second shared drain/source region of the multi-gate active device, adjacent to the first independent drain/source region. The dual sided contact switch has a gate region between the first independent drain/source region and the first shared drain/source region, and also between the second independent drain/source region and the second shared drain/source region.

20 Claims, 9 Drawing Sheets

(56) References Cited

U.S. PATENT DOCUMENTS

| | | | |
|---|---|---|---|
| 2012/0329277 A1* | 12/2012 | Zhu | H01L 21/76898 438/667 |
| 2015/0115416 A1* | 4/2015 | Costa | H01L 23/3737 257/632 |
| 2015/0137307 A1 | 5/2015 | Stuber | |
| 2015/0340765 A1* | 11/2015 | Dang | H01Q 21/0075 343/893 |
| 2016/0020173 A1 | 1/2016 | Wan | |
| 2017/0287836 A1 | 10/2017 | Wang et al. | |
| 2018/0114801 A1* | 4/2018 | Leipold | H01L 23/528 |

\* cited by examiner

CAPACITANCE BALANCE IN DUAL SIDED CONTACT SWITCH

TECHNICAL FIELD

The present disclosure generally relates to integrated circuits (ICs). More specifically, the present disclosure relates to capacitance and series resistance balance in a dual sided radio frequency switch with front-side contacts and backside contacts configured in accordance with a checker board layout.

BACKGROUND

The design complexity of integrated circuits (e.g., mobile radio frequency (RF) chips or transceivers) is complicated by added circuit functions to support communication enhancements. The design of these mobile RF transceivers may include the use of silicon-on-insulator technology. Silicon-on-insulator (SOI) technology replaces conventional semiconductor (e.g., silicon) substrates (e.g., wafers) with a layered silicon-insulator-silicon substrate to reduce parasitic device capacitance and improve performance.

The active devices on the SOI layer may include complementary metal oxide semiconductor (CMOS) transistors. RF switch devices of mobile RF transceivers may be fabricated using CMOS transistors on SOI substrates. Unfortunately, successful fabrication of transistors using SOI technology is complicated by a parasitic environment (e.g., parasitic capacitance). Parasitic capacitance may be caused by a proximity of an active device on the semiconductor layer and a semiconductor substrate supporting a buried oxide (BOX) layer in SOI devices.

Parasitic capacitance may also be caused by the interconnects to gates and source/drain regions of the CMOS transistors. This form of contact/interconnect-to-gate capacitance is caused by a proximity between back-end-of-line (BEOL) interconnects and/or middle-of-line (MOL) trench contacts/interconnects and the transistor gates as well as the transistor gate interconnects. This parasitic capacitance adversely affects the performance of CMOS devices, resulting in circuit delays and losses. This capacitance is especially problematic for RF switch devices.

SUMMARY

A dual sided contact switch has a first independent drain/source region of a multi-gate active device. The dual sided contact switch also has a first shared drain/source region of the multi-gate active device. The dual sided contact switch has a second independent drain/source region of the multi-gate active device, adjacent to the first shared drain/source region. The dual sided contact switch also has a second shared drain/source region of the multi-gate active device, adjacent to the first independent drain/source region. The dual sided contact switch has a gate region between the first independent drain/source region and the first shared drain/source region, and also between the second independent drain/source region and the second shared drain/source region.

A method of making a dual sided contact switch includes forming a first independent drain/source region of a multi-gate active device. The method also includes forming a first shared drain/source region of the multi-gate active device. The method includes forming a second independent drain/source region of the multi-gate active device, adjacent to the first shared drain/source region. The method also includes forming a second shared drain/source region of the multi-gate active device, adjacent to the first independent drain/source region. The method further includes forming a gate region between the first independent drain/source region and the first shared drain/source region, and between the second independent drain/source region and the second shared drain/source region.

A dual sided contact switch has a first independent drain/source region of a multi-gate active device. The dual sided contact switch also has a means for forming a portion of a first transistor and a second transistor. The multi-gate active device includes the first transistor and the second transistor. The dual sided contact switch also has a second independent drain/source region of the multi-gate active device, adjacent to the transistor forming means. The dual sided contact switch has a shared drain/source region of the multi-gate active device, adjacent to the first independent drain/source region. The dual sided contact switch has a gate region between the first independent drain/source region and the transistor forming means, and also between the second independent drain/source region and the shared drain/source region.

A radio frequency front end module includes a dual sided contact switch having a first independent drain/source region of a multi-gate active device. The dual sided contact switch has a first shared drain/source region of the multi-gate active device. The dual sided contact switch also has a second independent drain/source region of the multi-gate active device adjacent to the first shared drain/source region. The dual sided contact switch has a second shared drain/source region of the multi-gate active device adjacent to the first independent drain/source region. The dual sided contact switch has a gate region between the first independent drain/source region and the first shared drain/source region. The dual sided contact switch also has a gate region between the second independent drain/source region and the second shared drain/source region. The radio frequency front end module has an antenna coupled to the dual sided contact switch.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

Silicon-on-insulator (SOI) technology refers to the use of a layered silicon-insulator-silicon substrate in place of a conventional silicon substrate in semiconductor manufacturing, especially microelectronics, to reduce parasitic device capacitance, and improve performance. An integrated circuit built using SOI devices may show processing speed that is approximately thirty percent (30%) faster than a comparable bulk-based integrated circuit and power consumption reduced by as much as eighty percent (80%), which makes it ideal for mobile devices. SOI chips also reduce the soft error rate, which is data corruption caused by cosmic rays and natural radioactive background signals. SOI transistors offer a unique opportunity for CMOS architectures to be more scalable.

In some examples, a layer transfer process transfers a top active device portion of an SOI wafer to a handle wafer. In this process, the top portion of the SOI wafer is bonded to the handle wafer, and the bulk substrate layer (the sacrificial substrate) of the SOI wafer is removed. The process enables a backside connection system to be formed, in addition to a front-side connection system. For example, the back insulating layer may be thinned down. Openings may be formed in the back insulating layer so that backside contacts may be formed to connect to devices, such as a metal oxide semiconductor field effect transistor's (MOSFET's) source, drain, and/or body. In addition, one or more metal layers and vias may be formed on the back insulating layer to route power, ground, and/or signals to the devices. The backside contacts and one or more metal layers and vias form the backside connection system as compared to front-side contacts and metal layers and vias in the front-side connection system. Source and drain silicide is often specified to facilitate good connection between the front-side or backside connection system with the devices.

RF switch devices of mobile RF transceivers may be fabricated using CMOS transistors on SOI wafers. Unfortunately, successful fabrication of CMOS transistors using SOI technology is complicated by parasitic capacitance. For example, a parasitic capacitance in the form of contact/interconnect-to-gate capacitance may be caused by a proximity between back-end-of-line (BEOL) interconnects/middle-of-line (MOL) contacts and the transistor gates. This parasitic capacitance adversely affects the performance of CMOS devices, resulting in circuit delays and losses. This parasitic capacitance is especially problematic for RF switch devices.

Various aspects of the present disclosure provide techniques for balancing capacitance in a dual sided contact switch (e.g., RF switch). The process flow for semiconductor fabrication of the dual sided contact switch may include front-end-of-line (FEOL) processes, MOL processes, and BEOL processes.

The MOL process is the set of process steps that enable connection of the transistors to the back-end-of-line or BEOL interconnects (e.g., M1, M2, etc.) using MOL contacts. For example, parasitic capacitance in the form of contact/interconnect-to-gate capacitance is caused by proximity of the BEOL interconnects/MOL contacts and the transistor gates, drain, and source regions. The asymmetry of the parasitic capacitance adversely affects CMOS transistors, resulting in circuit delays and losses, which is especially problematic for RF switch devices. A layer transfer process may reduce the additional capacitance by moving some of the routing from a front-side to a backside of an RF integrated circuit. Moving some of the routing, however, may not sufficiently address the asymmetric issues with parasitic capacitance and series resistance.

To improve a figure of merit of the switch, a source and a drain of the switch can have contacts on different or opposite sides (e.g., a front-side and a backside) of the switch. Having the contacts on opposite sides of the switch reduces coupling capacitance and thereby improves (e.g., reduces) a figure of merit of the switch. The overall capacitance of a transistor between the source and drain, when off, is the contribution of the source-to-gate, drain-to-gate, source-to-channel, and drain-to-channel capacitances. A product of the resistance in an ON mode (Ron) and the capacitance in an OFF mode (Coff) of the stack in this RF domain yields a figure of merit (Ron*Coff) which represents the RF performance of the switch.

Having one contact on a drain of the switch/transistor on a first side of the switch and another contact on a source of the switch on a side that is opposite the first side introduces asymmetry. A parasitic environment introduced by source coupling to the gate is different than a parasitic environment introduced when the drain is coupled to the gate. For example, the asymmetry may be due to a difference in a sum of the parasitic capacitance on a front-side of the switch and a sum of the parasitic capacitance on the backside of the switch.

While the asymmetry, in this case, improves the figure of merit of the switch, there is a tradeoff with the linearity performance of the switch. For example, the switch operating under the asymmetric environment exhibits undesirable non-linear characteristics that adversely impact the performance of the switch. The undesirable non-linear characteristics may include harmonic distortion such as second harmonic distortion. Thus, while the asymmetric implementation improves the figure of merit, the performance of the switch is degraded due to second harmonic distortion.

Other implementations achieve symmetry by having contacts for the source and the drain on a same side of the switch. While these implementations reduce nonlinearity, the figure of merit of these implementations is degraded. Thus, it is desirable to introduce a switch with improved figure of merit and improved linearity.

Various aspects of the present disclosure are directed to an integrated circuit (e.g., a dual sided radio frequency switch) with improved figure of merit and improved linearity. The dual sided radio frequency switch balances capacitances and/or series resistance between the conductive (metal) layers of the integrated circuit. The dual sided radio frequency switch is a multi-gate active device.

In one aspect, the dual sided radio frequency switch includes a first unshared/independent drain/source region, a first shared drain/source region, a second independent drain/source region, a second shared drain/source region, a third independent drain/source region and a third shared drain/source region of the multi-gate active device. The shared drain/source regions and the independent drain/source regions are arranged in a checker board layout. For example, the shared drain/source regions and the independent drain/source regions are placed alternately to form a checker board layout.

The first shared drain/source region is between the first and the second independent drain/source regions and may be associated with a first active device and a second active device. For example, the first shared drain/source region is shared between the first active device and the second active device. Thus, the first independent drain/source region and at least a portion of the first shared drain/source region may be used to form the first active device. The second independent drain/source region and at least another portion of the first shared drain/source region may be used to form the second active device.

The third independent drain/source region is between the second and the third shared drain/source regions. For example, the second shared drain/source region is shared between a third active device and another active device. Thus, the third independent drain/source region and at least a portion of the second shared drain/source region may form a third active device. Similarly, the third shared drain/source region is shared between a fourth active device and yet another active device. Thus, the third independent drain/source region and at least a portion of the third shared drain/source region may be used to form a fourth active device.

The dual sided radio frequency switch further includes a first front-side conductive contact or interconnect on the first independent drain/source region and a second front-side contact on the second independent drain/source region. The dual-sided radio frequency switch further includes a first backside contact on the first shared drain/source region. Thus, the first backside contact is a shared source/drain contact. For example, the first backside contact is shared between the first active device and the second active device. In one aspect of the disclosure, the dual sided radio frequency switch includes a conductive bridge that connects the first front-side conductive contact or interconnect to the second front-side conductive contact.

The dual sided radio frequency switch further includes a third front-side conductive contact on the third independent drain/source region. The dual-sided radio frequency switch further includes a second backside contact on the second shared drain/source region and a third backside contact on the third shared drain/source region. Thus, the second backside contact is a shared source/drain contact that is shared between the third active device and another active device. The third backside contact is also a shared source/drain contact that is shared between the fourth active device and yet another active device. Similar to the shared drain/source regions and the independent drain/source regions, the front-side contacts and the backside contacts are arranged in the checker board layout.

Figure 1:
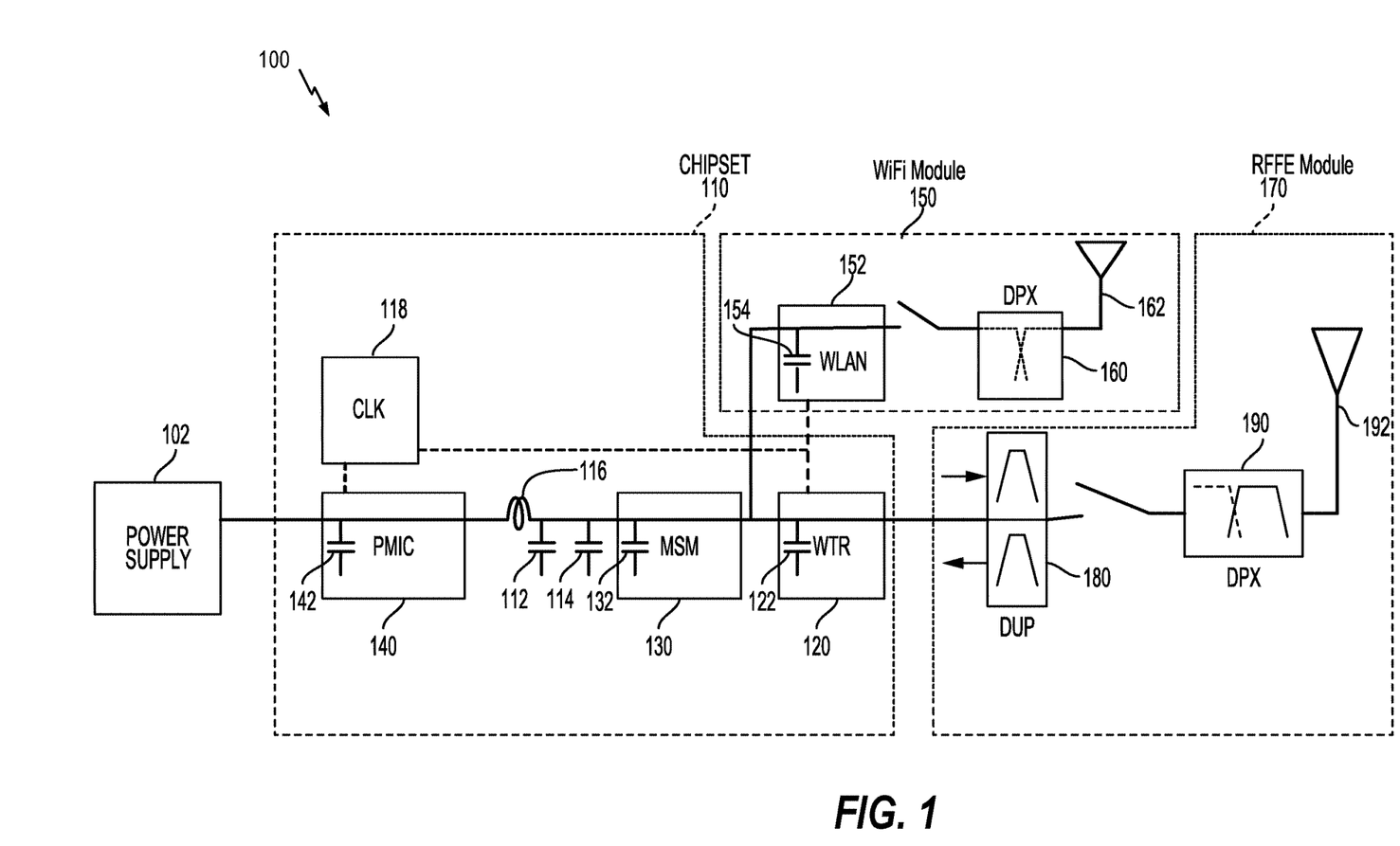
FIG. 1 is a schematic diagram of a radio frequency (RF) front-end module.

FIG. 1 is a schematic diagram of a wireless device 100 (e.g., a cellular phone or a smartphone) including the dual sided radio frequency switch implemented according to aspects of the present disclosure. Thus, the wireless device 100 benefits from the advantages of the dual sided radio frequency switch. The wireless device 100 may include a wireless local area network (WLAN) (e.g., WiFi) module 150 and an RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front-end module 170 may be implemented using a layer transfer process to further separate the active device from a substrate as shown in FIGS. 2A to 2D.

Figure 2A:
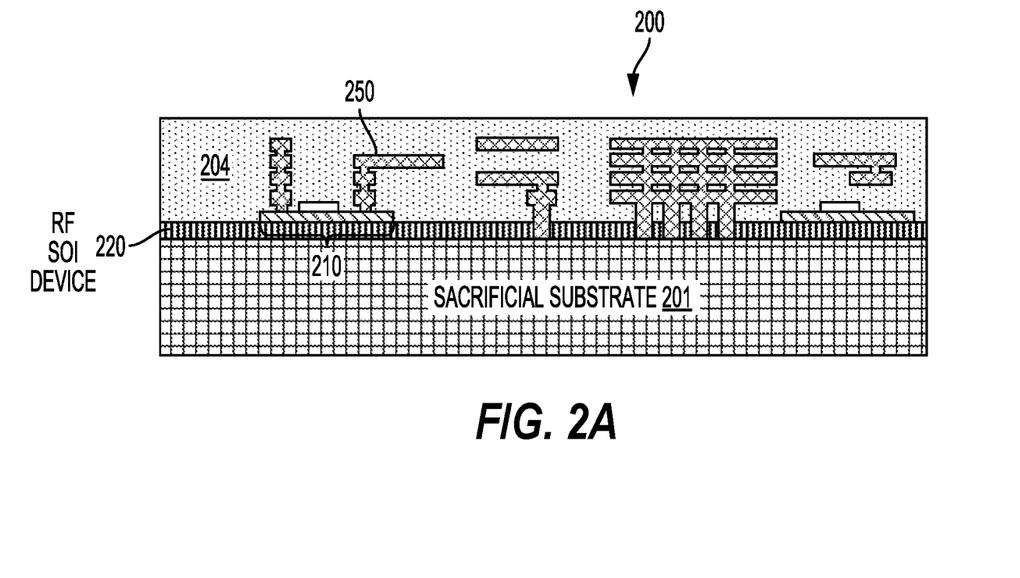
FIGS. 2A to 2D show cross-sectional views of a radio frequency integrated circuit (RFIC) during a layer transfer process.
Figure 2B:
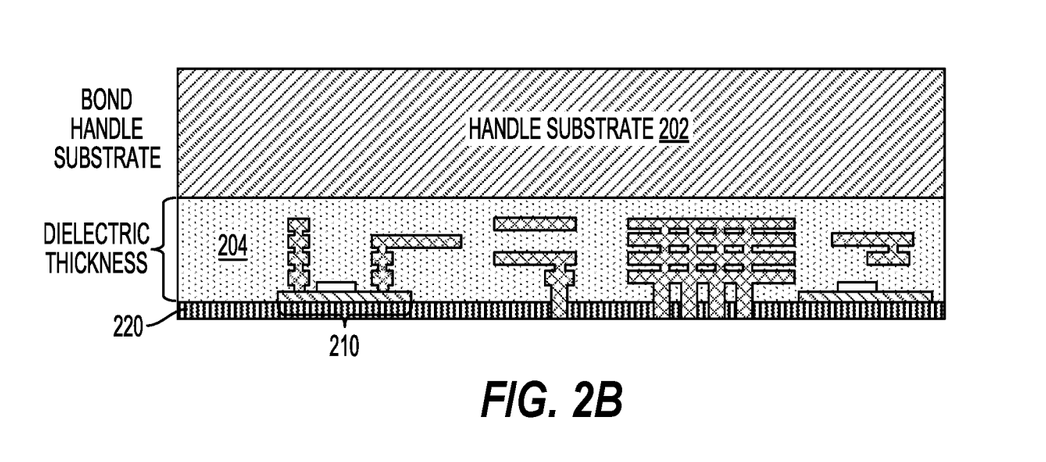

FIGS. 2A to 2D show cross-sectional views of a radio frequency (RF) integrated circuit 200 during a layer transfer process according to aspects of the present disclosure. As shown in FIG. 2A, an RF device includes an active device 210 on an insulator layer 220 supported by a sacrificial substrate 201 (e.g., a bulk wafer). The RF device also includes interconnects 250 coupled to the active device 210 within a first dielectric layer 204. As shown in FIG. 2B, a handle substrate 202 is bonded to the first dielectric layer 204 of the RF device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF device is proportional to the dielectric thickness, which determines the distance between the active device 210 and the handle substrate 202.

Figure 2C:
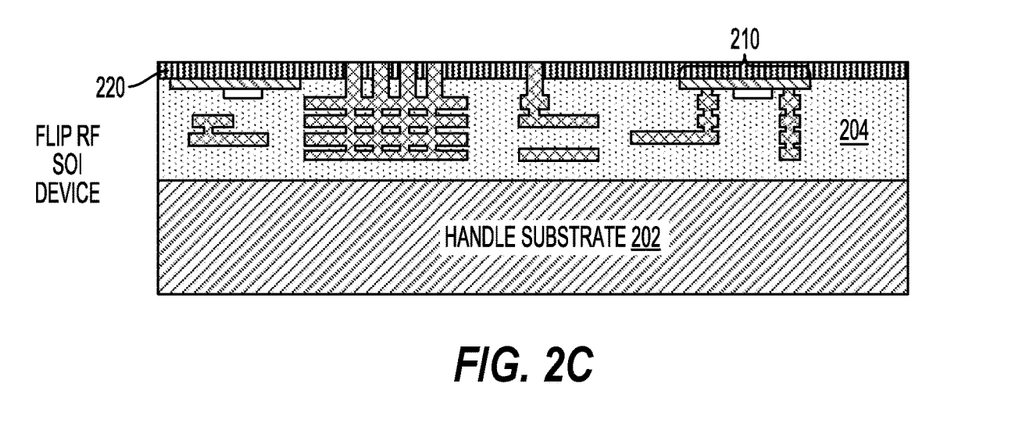
Figure 2D:
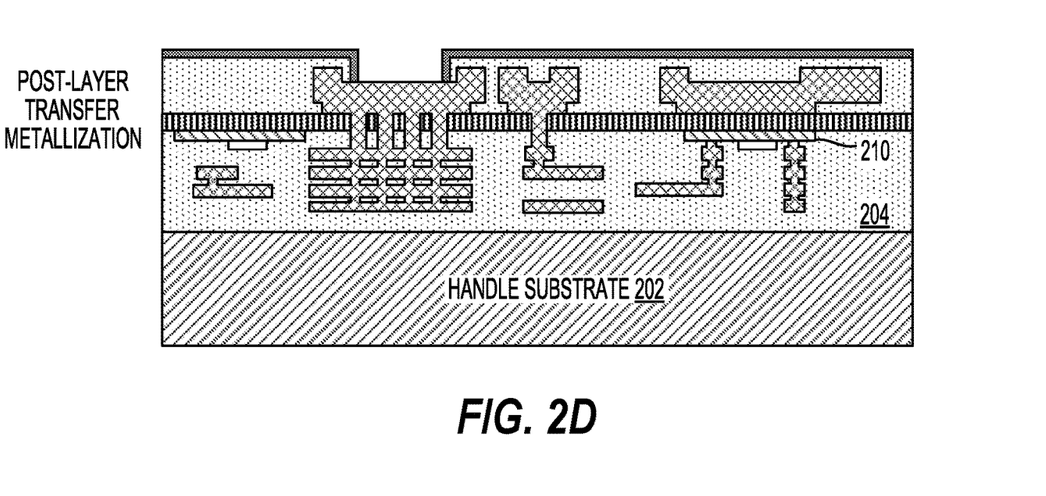

As shown in FIG. 2C, the RF device is flipped once the handle substrate 202 is secured and the sacrificial substrate 201 is removed. As shown in FIG. 2D, a post layer transfer metallization process is performed using, for example, a regular complementary metal oxide semiconductor (CMOS) process.

The active device 210 on the insulator layer 220 (e.g., BOX layer) may be a complementary metal oxide semiconductor (CMOS) transistor. The RF front-end module 170 (FIG. 1) may rely on these high performance CMOS RF switch technologies for successful operation.

Figure 3A:
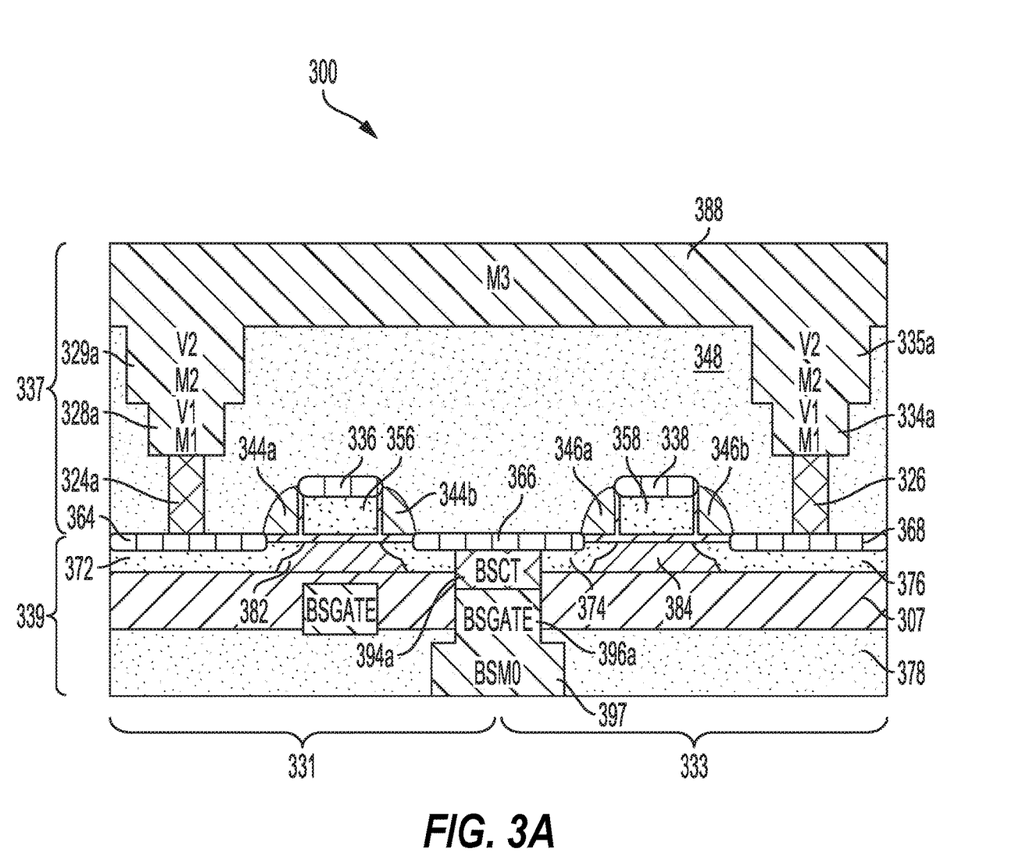
FIG. 3A illustrates a cross-section of a dual sided radio frequency switch, according to aspects of the present disclosure.

FIG. 3A illustrates a cross-section of a dual sided radio frequency switch 300, according to aspects of the present disclosure. The dual sided radio frequency switch 300 may be fabricated using a layer transfer process. The dual sided radio frequency switch 300 has a first side 337 (e.g., a front-side) and a second side 339 (e.g., a backside) opposite the first side 337.

The dual sided radio frequency switch 300 includes a first active device 331 (e.g., a transistor) and a second active device 333, each having a gate and source/drain regions. Thus, the dual sided radio frequency switch 300 is a multi-gate active device. The dual sided radio frequency switch 300 further includes a first independent drain/source region 372, a first shared drain/source region 374, and a second independent drain/source region 376. The first shared drain/source region 374 is between the first independent drain/source region 372 and the second independent drain/source region 376.

The first active device 331 of the dual sided radio frequency switch 300 includes a first gate 356, the first independent drain/source region 372, at least a first portion of the first shared drain/source region 374, and a first channel 382 formed on an isolation layer 307. The first gate 356 has spacers 344a and 344b.

The second active device 333 of the dual sided radio frequency switch 300 includes a second gate 358, the second independent drain/source region 376, at least a second portion of the first shared drain/source region 374, and a second channel 384 formed on the isolation layer 307. The second gate 358 has spacers 346a and 346b.

In SOI implementations, the isolation layer 307 is a buried oxide (BOX) layer, and the body (e.g., including the first channel 382 and the second channel 384) and the source/drain regions (e.g., the first independent drain/source region 372, the first shared drain/source region 374, and the second independent drain/source region 376) are formed from an SOI layer (e.g., silicon) including shallow trench isolation (STI) regions.

One aspect of the present disclosure uses a silicidation process (e.g., a backside/front-side silicidation process) with layer transfer to form front-side/backside source/drain contacts. For example, a first front-side contact 364, a backside contact 366, and a second front-side contact 368 are respectively formed on the first independent drain/source region 372, the first shared drain/source region 374, and the second independent drain/source region 376. A first gate contact 336 and a second gate contact 338 are respectively formed on the first gate 356 and on the second gate 358 of the dual sided radio frequency switch 300. The first gate contact 336, the second gate contact 338, the first front-side contact 364, the backside contact 366, and the second front-side contact 368 can be silicide contacts.

In one aspect of the disclosure, the backside contact 366 is a backside shared source/drain contact. For example, the backside contact 366 is shared between the first active device 331 and the second active device 333. This follows because the first shared drain/source region 374 is a shared source/drain region for the first active device 331 and the second active device 333.

The dual sided radio frequency switch 300 further includes a first front-side conductive contact or interconnect 324a coupled to the first independent drain/source region 372/first front-side contact 364 and a second front-side contact 326 on the second independent drain/source region 376/second front-side contact 368. The dual sided radio frequency switch 300 further includes a backside contact 394a on the first shared drain/source region 374. As noted, the first shared drain/source region 374 is a shared source/drain region and the first backside contact 394a is a shared source/drain contact for the first active device 331 and the second active device 333.

The interconnects of the dual sided radio frequency switch 300 may also include trench interconnects and vias for coupling active devices formed during the FEOL process to metallization layers formed during the BEOL process. Front-side metallization layers are formed in a front-side dielectric layer 348 and backside metallization layers are formed in a backside dielectric 378.

For example, the first front-side conductive contact or interconnect 324a is connected or coupled to the first front-side contact 364 formed on the first independent drain/source region 372. The second front-side conductive contact 326 is connected or coupled to the second front-side contact 368 formed on the second independent drain/source region 376. The first front-side conductive contact 324a and the second front-side conductive contact 326, respectively, couple the first active device 331 and the second active device 333 to metallization in the BEOL layer.

The dual sided radio frequency switch 300 includes a backside trench interconnect and/or via 396a to couple the first active device 331 and the second active device 333 to the backside metallization (e.g., a second conductive bridge 397). In one aspect, the backside trench interconnect and/or via 396a is coupled to the backside contact 394a, which is shared between the first active device 331 and the second active device 333.

In addition, the dual sided radio frequency switch 300 includes a first front-side trench interconnect and/or via 328a, a second front-side trench interconnect and/or via 329a, a third front-side trench interconnect and/or via 334a, and a fourth front-side trench interconnect and/or via 335a. The first front-side trench interconnect and/or via 328a couples a first front-side metallization M1 associated with the first active device 331 to a second front-side metallization M2 associated with the first active device 331. The second front-side trench interconnect and/or via 329a couples the second front-side metallization M2 associated with the first active device 331 to a third front-side metallization M3.

The third front-side trench interconnect and/or via 334a couples a first front-side metallization M1 associated with the second active device 333 to a second front-side metallization M2 associated with the second active device 333. The fourth front-side trench interconnect and/or via 335a couples the second front-side metallization M2 associated with the second active device 333 to the third front-side metallization M3. In one aspect of the disclosure, the third front-side metallization M3 includes a first conductive bridge 388 that is common to the first active device 331 and the second active device 333. For example, the first conductive bridge 388 couples the first active device 331 to the second active device 333 on the front-side 337 of the dual sided radio frequency switch 300.

Figure 3B:
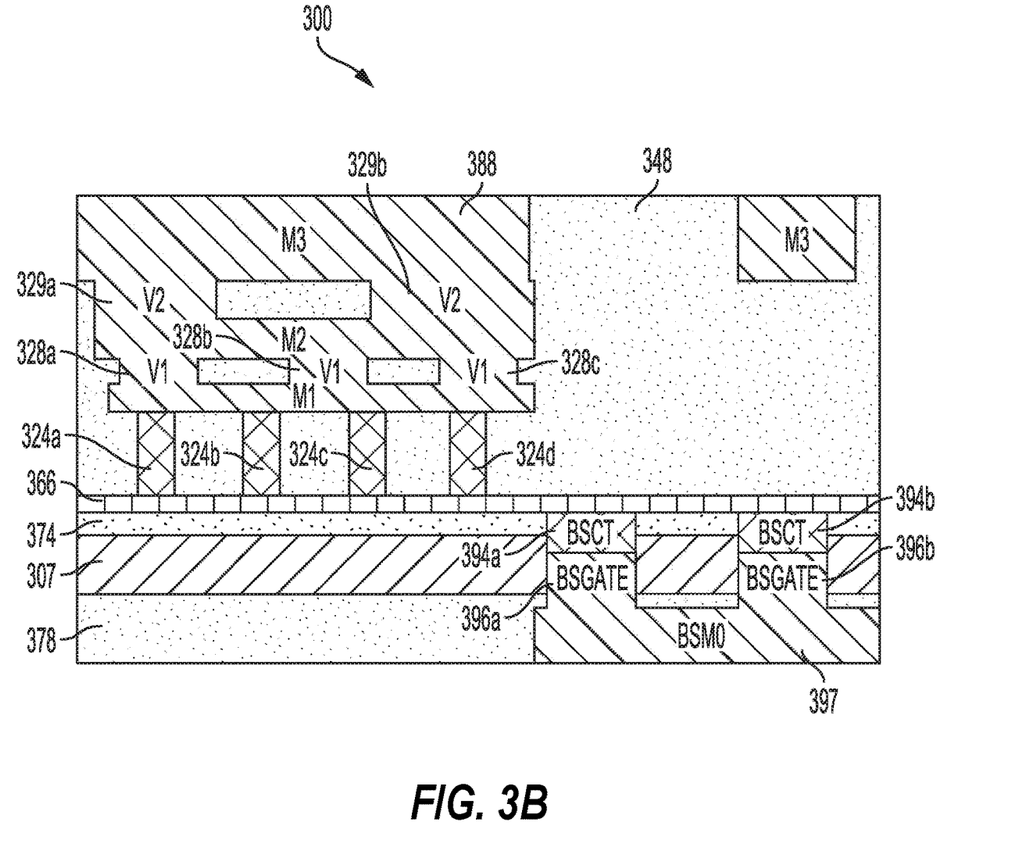
FIG. 3B illustrates another cross-section of a dual sided radio frequency switch, according to aspects of the present disclosure.
Figure 3C:
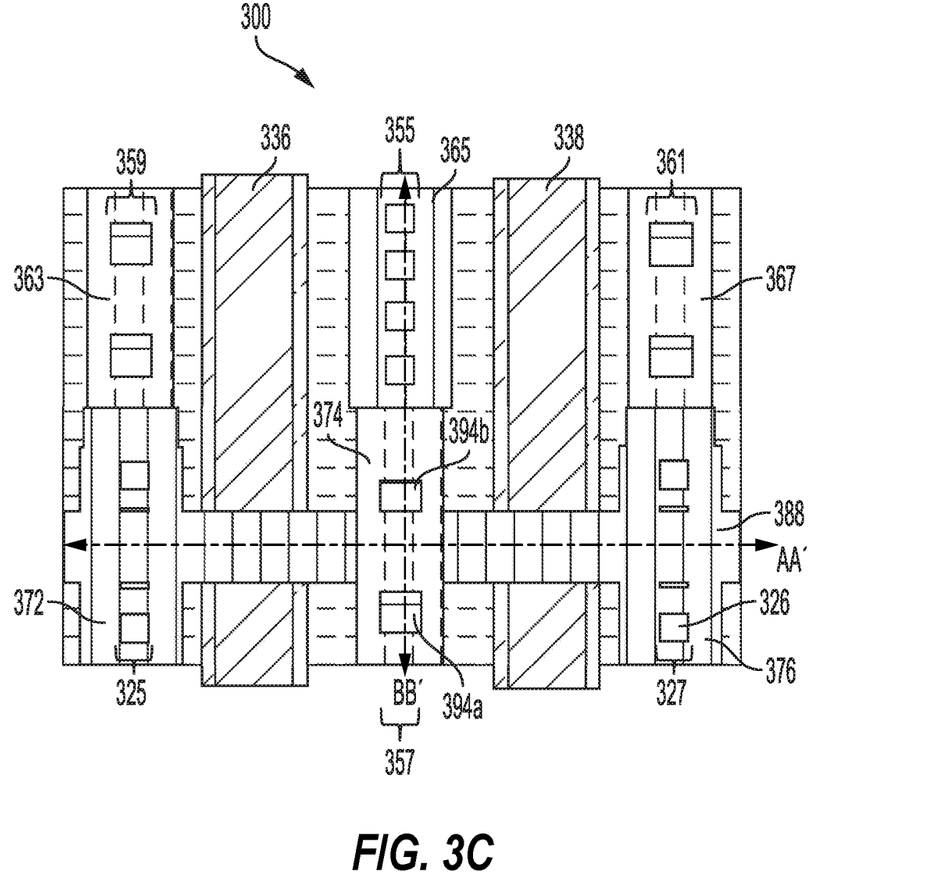
FIG. 3C illustrates a top view of a dual sided radio frequency switch with front-side contacts and backside contacts configured in accordance with a checker board layout, according to aspects of the present disclosure.

FIG. 3B illustrates another cross-section of the dual sided radio frequency switch 300, according to aspects of the present disclosure. The cross-section of FIG. 3B is taken across an axis BB' that is orthogonal to an axis AA' of the cross-section of FIG. 3A, as shown in FIG. 3C. For example, the cross-section of FIG. 3B includes multiple first front-side conductive contacts 324a, 324b, 324c, and 324d associated with multiple gates of the multi-gate active device. Each of the first front-side conductive contacts 324a, 324b, 324c, and 324d is coupled to the first front-side metallization M1.

The cross-section of FIG. 3B includes multiple first front-side trench interconnects and/or vias 328a, 328b, and 328c. Each of the first front-side trench interconnects and/or vias 328a, 328b, and 328c couple the first front-side metallization M1 to the second front-side metallization M2. The cross-section of FIG. 3B also shows multiple second front-side trench interconnects and/or vias 329a and 329b. Each of the second front-side trench interconnects and/or vias 329a and 329b couple the second front-side metallization M2 to the third front-side metallization M3.

The cross-section of FIG. 3B further includes multiple backside contacts (e.g., a first backside contact 394a and a second backside contact 394b). Multiple backside trench interconnects and/or vias 396a and 396b, respectively, couple the first backside contact 394a and the second backside contact 394b to the backside metallization that includes the second conductive bridge 397. In one aspect, the second backside contact 394b is fabricated on a fourth drain/source region (not shown).

FIG. 3C illustrates a top view of a dual sided radio frequency switch with front-side contacts and backside contacts arranged in a checker board layout, according to aspects of the present disclosure. As noted, the cross-section of FIG. 3B is taken across the axis BB' that is orthogonal to the axis AA' of the cross-section of FIG. 3A.

The dual sided radio frequency switch 300 includes a first set of front-side conductive contacts 325 in a first independent drain/source region 372, a second set of front-side conductive contacts 327 in a second independent drain/source region 376, and a third set of front-side conductive contacts 355 in a third independent drain/source region 365. The independent drain/source regions 372, 376, 365 are arranged in a checker board layout or in an alternate configuration. That is, the first, second and third sets of front-side contacts (as well as independent drain/source regions) are offset from one another, as seen in FIG. 3C. Offsetting helps balance capacitance and series resistance.

The dual sided radio frequency switch 300 also includes multiple spacers 344a, 344b, 346a, and 346b. The first set of front-side conductive contacts 325 includes multiple first front-side conductive contacts for coupling the multiple active devices to the different metallization layers. The second set of front-side conductive contacts 327 and the third set of front-side conductive contacts 355 also include a same or different number of front-side conductive contacts as the first set of front-side conductive contacts 325.

In one aspect, the first set of front-side conductive contacts 325 are associated with the first independent drain/source region 372 and the first front-side contact 364. The second set of front-side conductive contacts 327 are associated with the second independent drain/source region 376 and the second front-side contact 368. The third set of front-side conductive contacts 355 are associated with a third independent drain/source region 365.

The dual sided radio frequency switch 300 includes a first set of backside conductive contacts 357 in a first shared drain/source region 374, a second set of backside conductive contacts 359 in a second shared drain/source region 363, and a third set of backside conductive contacts 361 in a third shared drain/source region 367. The first shared drain/source region 374 is connected to the third drain/source region 365 to form a continuous drain/source region. The first independent drain/source region 372 is connected to the second shared drain/source region 363 to form a continuous drain/source region. The second independent drain/source region 376 is connected to the third shared drain/source region 367 to form a continuous drain/source region. Backside contacts 394a and 394b of the first set of backside conductive contacts 357 are larger than the front-side conductive contacts 324a, 324b, 324c, and 324 (FIG. 3A and FIG. 3B) of the first set of front-side conductive contacts 325, contributing to the asymmetric parasitics. The first, second and third sets of backside conductive contacts (as well as shared drain/source regions) are arranged in a checker board or alternative layout, as seen in FIG. 3C, to help balance the parasitics, e.g., capacitance and series resistance.

The first set of backside conductive contacts 357 includes multiple backside contacts 394*a* and 394*b* for coupling the multiple active devices to the different metallization layers. The second set of backside conductive contacts 359 and the third set of backside conductive contacts 361 also include a same or different number of backside conductive contacts as the first set of backside conductive contacts 357.

The first gate contact 336 in a first gate region is between the first independent drain/source region 372 and the first shared drain/source region 374. The first gate contact 336 is also between the third independent drain/source region 365 and the second shared drain/source region 363. The second gate contact 338 in a second gate region is between the second independent drain/source region 376 and the first shared drain/source region 374. The second gate contact 338 is also between the third drain/source region 365 and the third shared drain/source region 367.

Figure 4:
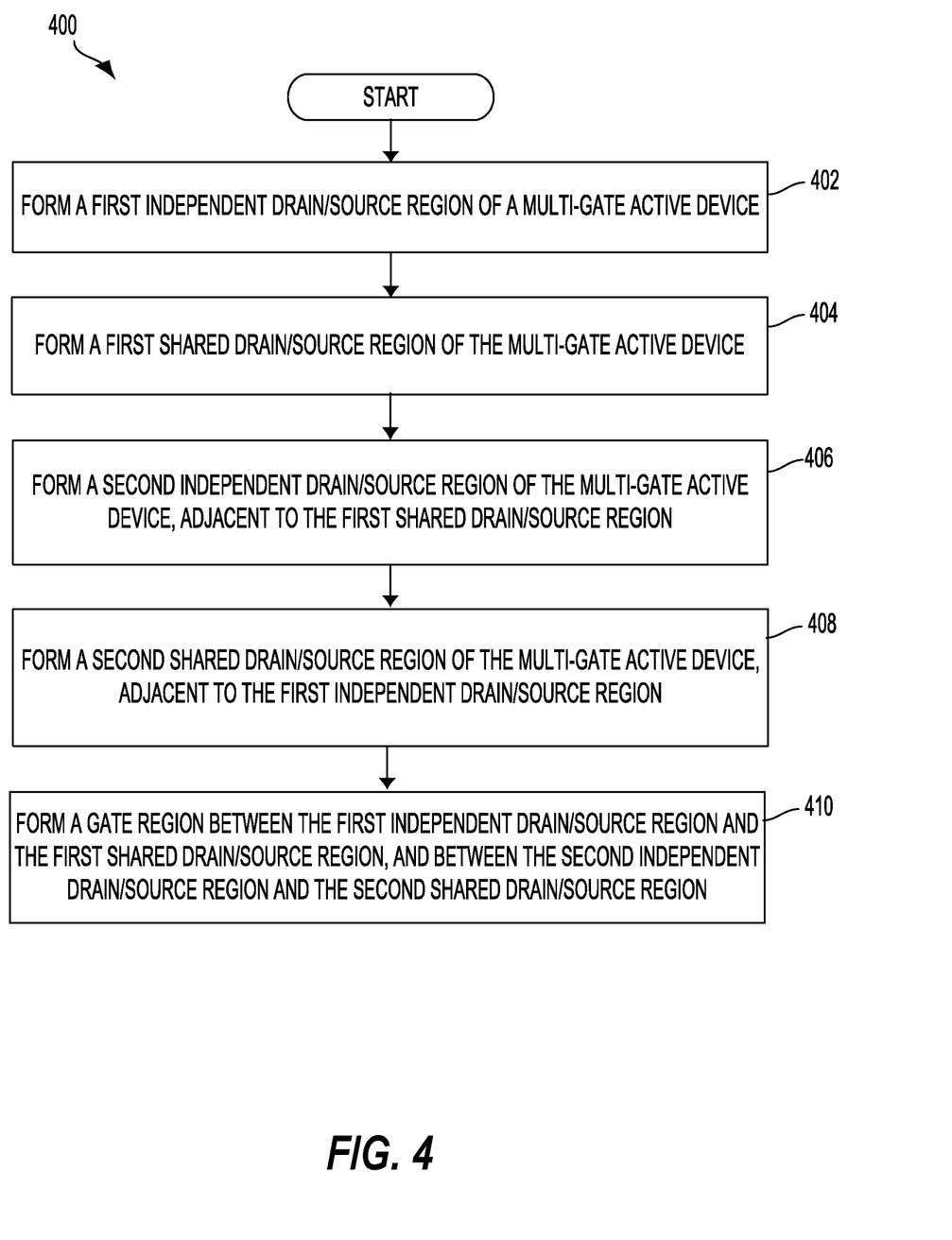
FIG. 4 is a process flow diagram illustrating a method of constructing a radio frequency integrated circuit switch using a bulk semiconductor layer transfer process according to aspects of the present disclosure.

FIG. 4 is a process flow diagram illustrating a method 400 of fabricating a dual sided contact switch, according to an aspect of the present disclosure. In block 402, a first independent drain/source region of a multi-gate active device is formed. In block 404, a first shared drain/source region of the multi-gate active device is formed. In block 406, a second independent drain/source region of the multi-gate active device is formed adjacent to the first shared drain/source region. In block 408, a second shared drain/source region of the multi-gate active device is formed adjacent to the first independent drain/source region. In block 410, a gate region is formed between the first independent drain/source region and the first shared drain/source region. The gate region is also formed between the second independent drain/source region and the second shared drain/source region.

According to a further aspect of the present disclosure, a dual sided contact switch is described. The dual sided contact switch includes means for forming a portion of a first transistor and a portion of a second transistor. The transistor forming means may be the first shared drain/source region 374, shown in FIGS. 3A, 3B, and 3C. In another aspect, the aforementioned means may be any module or any apparatus configured to perform the functions recited by the aforementioned means.

Figure 5:
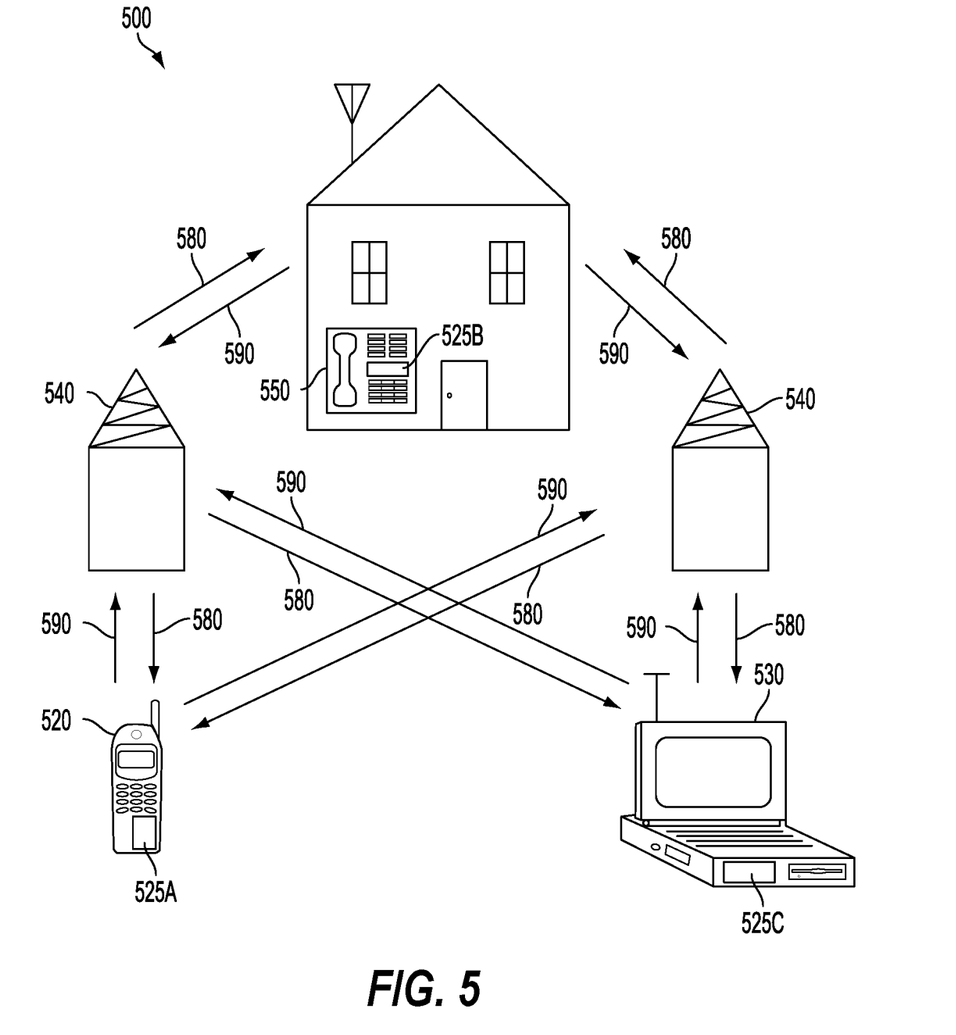
FIG. 5 is a block diagram showing an exemplary wireless communication system in which a configuration of the present disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed dual sided contact switch. It will be recognized that other devices may also include the disclosed dual sided contact switch, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed dual sided contact switch.

Figure 6:
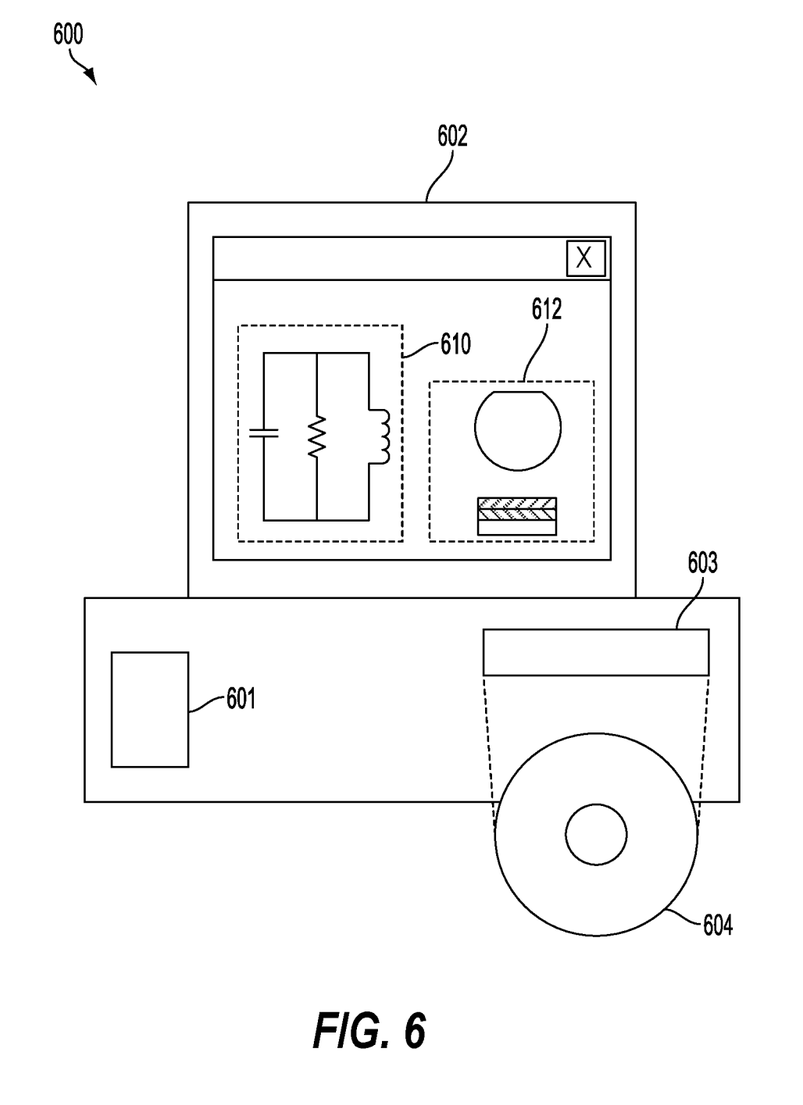
FIG. 6 is a block diagram illustrating a design workstation used for circuit, layout, and logic design of a semiconductor component according to one configuration of the present disclosure.

FIG. 6 is a block diagram illustrating a design workstation used for circuit, layout, and logic design of a semiconductor component, such as the RF devices disclosed above. A design workstation 600 includes a hard disk 601 containing operating system software, support files, and design software such as Cadence or OrCAD. The design workstation 600 also includes a display 602 to facilitate a circuit design 610 or a dual sided contact switch design 612. A storage medium 604 is provided for tangibly storing the circuit design 610 or the dual sided contact switch design 612. The circuit design 610 or the dual sided contact switch design 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the circuit design 610 or the dual sided contact switch design 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A dual sided contact switch comprising:
   a first independent drain/source region of a multi-gate active device;
   a first shared drain/source region of the multi-gate active device;
   a second independent drain/source region of the multi-gate active device, adjacent to the first shared drain/source region;
   a second shared drain/source region of the multi-gate active device, adjacent to the first independent drain/source region;
   a gate region between the first independent drain/source region and the first shared drain/source region, and also between the second independent drain/source region and the second shared drain/source region;
   a first front-side contact coupled to the first independent drain/source region;
   a first backside contact coupled to the first shared drain/source region;
   a second front-side contact coupled the second independent drain/source region; and
   a second backside contact coupled to the second shared drain/source region.

2. The dual sided contact switch of claim 1, in which the first front-side contact, the first backside contact, the second front-side contact, and the second backside contact comprise silicide.

3. The dual sided contact switch of claim 1, further comprising:
   a third independent drain/source region of the multi-gate active device, the third independent drain/source region coupled to a third front-side contact; and
   a first conductive bridge to couple the first front-side contact and the third front-side contact.

4. The dual sided contact switch of claim 1, in which a first transistor comprises the first independent drain/source region, at least a portion of the first shared drain/source region and a first gate between the first independent drain/source region and the first shared drain/source region.

5. The dual sided contact switch of claim 1, in which the dual sided contact switch comprises a radio frequency (RF) dual sided contact switch.

6. The dual sided contact switch of claim 1, further comprising:
   a third independent drain/source region of the multi-gate active device, adjacent to the first shared drain/source region;
   a third shared drain/source region of the multi-gate active device, adjacent to the second independent drain/source region; and
   a second gate region between the third independent drain/source region and the first shared drain/source region, and also between the third shared drain/source region and the second independent drain/source region.

7. The dual sided contact switch of claim 6, further comprising:
   a third backside contact coupled to the third shared drain/source region.

8. A method of making a dual sided contact switch comprising:
   forming a first independent drain/source region of a multi-gate active device;
   forming a first shared drain/source region of the multi-gate active device;
   forming a second independent drain/source region of the multi-gate active device, adjacent to the first shared drain/source region;
   forming a second shared drain/source region of the multi-gate active device, adjacent to the first independent drain/source region;
   forming a gate region between the first independent drain/source region and the first shared drain/source region, and between the second independent drain/source region and the second shared drain/source region;
   fabricating a first front-side contact coupled to the first independent drain/source region;
   fabricating a first backside contact coupled to the first shared drain/source region;
   fabricating a second front-side contact coupled the second independent drain/source region; and
   fabricating a second backside contact coupled to the second shared drain/source region.

9. The method of claim 8, further comprising:
   forming a third independent drain/source region of the multi-gate active device, the third independent drain/source region coupled to a third front-side contact; and
   fabricating a first conductive bridge to couple the first front-side contact and the third front-side contact.

10. The method of claim 8, further comprising:
   forming a third independent drain/source region of the multi-gate active device, adjacent to the first shared drain/source region;
   forming a third shared drain/source region of the multi-gate active device, adjacent to the second independent drain/source region; and
   forming a second gate region between the third independent drain/source region and the first shared drain/source region, and also between the third shared drain/source region and the second independent drain/source region.

11. A dual sided contact switch comprising:
a first independent drain/source region of a multi-gate active device;
means for forming a portion of a first transistor and a second transistor; the multi-gate active device including the first transistor and the second transistor;
a second independent drain/source region of the multi-gate active device, adjacent to the transistor forming means;
a shared drain/source region of the multi-gate active device, adjacent to the first independent drain/source region;
a gate region between the first independent drain/source region and the transistor forming means, and also between the second independent drain/source region and the shared drain/source region;
a first front-side contact coupled to the first independent drain/source region;
a first backside contact coupled to the transistor forming means;
a second front-side contact coupled the second independent drain/source region; and
a second backside contact coupled to the shared drain/source region.

12. The dual sided contact switch of claim 11, in which the first front-side contact, the first backside contact, the second front-side contact, and the second backside contact comprise silicide.

13. The dual sided contact switch of claim 11, further comprising:
a third independent drain/source region of the multi-gate active device, the third independent drain/source region coupled to a third front-side contact; and
a first conductive bridge to couple the first front-side contact and the third front-side contact.

14. The dual sided contact switch of claim 11, in which the first transistor comprises the first independent drain/source region, at least a portion of the transistor forming means and a first gate between the first independent drain/source region and the transistor forming means.

15. The dual sided contact switch of claim 11, in which the dual sided contact switch comprises a radio frequency (RF) dual sided contact switch.

16. A radio frequency front end module comprising:
a dual sided contact switch having a first independent drain/source region of a multi-gate active device, a first shared drain/source region of the multi-gate active device, a second independent drain/source region of the multi-gate active device, adjacent to the first shared drain/source region, a second shared drain/source region of the multi-gate active device, adjacent to the first independent drain/source region,
a gate region between the first independent drain/source region and the first shared drain/source region, and also between the second independent drain/source region and the second shared drain/source region;
a first front-side contact coupled to the first independent drain/source region;
a first backside contact coupled to the first shared drain/source region;
a second front-side contact coupled the second independent drain/source region; and
a second backside contact coupled to the second shared drain/source region; and
an antenna coupled to the dual sided contact switch.

17. The radio frequency front end module of claim 16, in which the first front-side contact, the first backside contact, the second front-side contact, and the second backside contact comprise silicide.

18. The radio frequency front end module of claim 16, in which the dual sided contact switch further comprises:
a third independent drain/source region of the multi-gate active device, the third independent drain/source region coupled to a third front-side contact; and
a first conductive bridge to couple the first front-side contact and the third front-side contact.

19. The radio frequency front end module of claim 16, in which a first transistor comprises the first independent drain/source region, at least a portion of the first shared drain/source region and a first gate between the first independent drain/source region and the first shared drain/source region.

20. The radio frequency front end module of claim 16, in which the dual sided contact switch further comprises:
a third independent drain/source region of the multi-gate active device, adjacent to the first shared drain/source region;
a third shared drain/source region of the multi-gate active device, adjacent to the second independent drain/source region; and
a second gate region between the third independent drain/source region and the first shared drain/source region, and also between the third shared drain/source region and the second independent drain/source region.

* * * * *

UNITED STATES PATENT AND TRADEMARK OFFICE
CERTIFICATE OF CORRECTION

PATENT NO. : 10,707,866 B1  
APPLICATION NO. : 16/230884  
DATED : July 7, 2020  
INVENTOR(S) : Qingqing Liang et al.

Page 1 of 1

It is certified that error appears in the above-identified patent and that said Letters Patent is hereby corrected as shown below:

On the Title Page

(72) Inventors: George Peter Imthurn should be George Pete Imthurn

Signed and Sealed this
Fifteenth Day of December, 2020

Andrei Iancu
*Director of the United States Patent and Trademark Office*